United States Patent
Demange

(10) Patent No.: US 8,264,257 B2
(45) Date of Patent: Sep. 11, 2012

(54) INTEGRATED CIRCUIT COMPRISING A BROADBAND HIGH VOLTAGE BUFFER

(75) Inventor: Nicolas Demange, Saint Maximin la Sainte Baume (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 153 days.

(21) Appl. No.: 12/828,052

(22) Filed: Jun. 30, 2010

(65) Prior Publication Data

US 2011/0001558 A1 Jan. 6, 2011

(30) Foreign Application Priority Data

Jul. 1, 2009 (FR) ...................................... 09 03230

(51) Int. Cl.
*H03K 3/00* (2006.01)
(52) U.S. Cl. .......................... 327/112; 327/333; 327/108
(58) Field of Classification Search .................... 327/112
See application file for complete search history.

(56) References Cited

U.S. PATENT DOCUMENTS

| | | | |
|---|---|---|---|
| 6,018,257 A | 1/2000 | Hung et al. | |
| 6,861,739 B1 * | 3/2005 | Bhavnagarwala et al. | 257/691 |
| 7,268,588 B2 * | 9/2007 | Sanchez et al. | 326/68 |
| 7,328,849 B2 * | 2/2008 | Leaming | 235/492 |
| 7,463,073 B2 * | 12/2008 | Chung et al. | 327/112 |
| 7,579,882 B2 * | 8/2009 | Sakamoto et al. | 327/112 |
| 7,639,059 B1 * | 12/2009 | Yu et al. | 327/333 |
| 7,663,399 B2 * | 2/2010 | Rho | 326/32 |
| 7,868,659 B2 * | 1/2011 | Ker et al. | 326/81 |
| 2003/0112041 A1 | 6/2003 | Clark et al. | |
| 2004/0119526 A1 * | 6/2004 | Ajit | 327/536 |
| 2005/0219778 A1 * | 10/2005 | Shigenari | 361/56 |
| 2006/0103435 A1 | 5/2006 | Chen et al. | |
| 2006/0232307 A1 * | 10/2006 | Kanno et al. | 327/112 |
| 2007/0085576 A1 * | 4/2007 | Sanchez | 327/112 |
| 2009/0248930 A1 * | 10/2009 | Garlapati et al. | 710/106 |

* cited by examiner

*Primary Examiner* — Thomas J Hiltunen
(74) *Attorney, Agent, or Firm* — Seed IP Law Group PLLC

(57) ABSTRACT

The disclosure relates to an integrated circuit comprising a data buffer circuit comprising first and second transistors coupled to a contact pad and third and fourth transistors. A first bias voltage is applied on a conduction terminal of the third transistor and a second bias voltage is applied on a conduction terminal of the fourth transistor. A third bias voltage less than the second bias voltage is applied on a control terminal of the first transistor and a fourth bias voltage greater than the first bias voltage is applied on a control terminal of the second transistor. Application notably for the production of a so-called "High Speed" USB port.

27 Claims, 5 Drawing Sheets

INTEGRATED CIRCUIT COMPRISING A
BROADBAND HIGH VOLTAGE BUFFER

BACKGROUND

1. Technical Field

The present disclosure relates to the production of an integrated circuit on a semiconductor wafer, comprising a data buffer circuit connected to a contact pad.

The present disclosure in particular relates to the production of a data buffer circuit that is compatible with both the "High Speed" USB (Universal Serial Bus) specification and the "Full Speed" USB specification.

2. Description of the Related Art

FIG. 1 shows an integrated circuit IC comprising a conventional data buffer circuit CBUF and a contact pad IOP ("I/O Pad"). The buffer circuit CBUF comprises two transistors T1, T2 of MOS (Metal Oxide Semiconductor) technology. The transistor T1 is of the type PMOS and the transistor T2 is of the type NMOS. The transistor T1 receives on its source (S) a voltage Vcc. The drain (D) of transistor T1 is connected to the drain (D) of transistor T2, the source of which is linked to ground (GND). The drains (D) of the transistors T1, T2 are connected to the pad IOP. The gate (G) of transistor T1 receives a data signal DT1 (i.e., a data carrying signal) and the gate of transistor T2 receives a data signal DT2, the signals DT1, DT2 being supplied by a circuit CT.

Table 1 below describes the functioning of the buffer circuit CBUF. The buffer circuit functions as an inverter and supplies to the pad IOP a signal DOUT that is the inverse of signals DT1, DT2. The signals DT1, DT2 are identical during a data transmission, and can therefore be considered as a single and same data signal. Outside of the data transmission periods, they are respectively set at 1 and 0 to place the buffer circuit in a high impedance state (transistors T1, T2 non-conducting).

TABLE 1

| DT1 (T1) | DT2 (T2) | DOUT |
|---|---|---|
| 0 (GND) | 0 (GND) | 1 (Vcc) |
| 1 (Vcc) | 1 (Vcc) | 0 (GND) |
| 1 (Vcc) | 0 (GND) | HZ (high impedance) |

The electric characteristics of the buffer circuit CBUF are, in practice, highly dependent upon those of the transistors T1, T2 of which it is composed. During the conception of the integrated circuit, a specification list defines the desired performances in terms of the withstand voltage (maximum continuous voltage that the buffer circuit should be able to withstand), of the pass band (maximum frequency of data signals that the buffer circuit should be able to transmit), and of the resistance to electrostatic discharges (maximum discharge voltage that the buffer circuit should be able to withstand).

To make low-cost integrated circuits, circuit designers try to design such a buffer circuit with the transistors at their disposal, that is, the transistors used for the rest of the integrated circuit. In the case of an integrated circuit comprising a non-volatile memory, for example an electrically erasable and programmable memory of the type EEPROM or Flash-EEPROM, designers have at their disposal two types of transistors:

high voltage transistors with a thick oxide, used to produce the non-volatile memory and able to withstand a voltage on the order of 10 V (for example a voltage for programming or erasing), and transistors with a thin gate oxide (called "logic" transistors, i.e., allowing logic circuitry to be produced).

However, the logic transistors have a broad pass band but a low withstand voltage, and the high voltage transistors have a small pass band: if the frequency of the signals DT1, DT2 increases, they are not able to "follow" the signal variations and transmit the data (they switch too slowly from the conducting state to the non-conducting state and vice-versa).

Thus, it may be that conventional transistors of an integrated circuit do not allow a buffer circuit offering the desired performances in terms of withstand voltage and of pass band to be produced. The designers must therefore provide specific transistors, causing an increase of the cost price of the integrated circuit because the addition of a third type of transistor requires the provision of diverse additional steps in the fabrication process of the integrated circuit.

The USB standard specifications are a typical example of a specification list that can be problematic. It is known to produce buffer circuits able to meet the "Full Speed" USB specification by using conventional high voltage transistors, because the "Full Speed" USB specification requires a fairly low data transfer frequency, on the order of 12 MHz (that is, 12 Mb/s). However, the "High Speed" USB specification requires a data transfer frequency of 480 MHz (that is, 480 Mbit/s) with differential data signals D+, D− that can be between 400 and 800 mV (that is a 400 mV voltage differential).

More particularly, the differential signals D+, D− transmitted on a USB bus have voltage levels of 0.0 to 0.3 V for the low level (logic 0) and from 2.8 to 3.6 V for the high level (logic 1) in "Full Speed" (FS) mode. In "High Speed" (HS) mode, these signals vary from −10 to +10 mV for the low level and from 360 to 440 mV for the high level.

The "High Speed" specification is therefore more restrictive than the "Full Speed" specification in terms of pass band, but less restrictive in terms of withstand voltage because the data are carried by lower voltages. Nevertheless, a USB buffer circuit provided to emit signals in "High Speed" mode must be able to resist the maximum voltage of 3.6 V required by the "Full Speed" specifications because a data transmission in "High Speed" mode must first be negotiated in "Full Speed" mode before it is switched into the "High Speed" mode. Conventional high voltage transistors can resist such a voltage, but do not allow a buffer circuit in conformance with the USB "High Speed" specifications to be produced because the pass band is too small.

BRIEF SUMMARY

The present disclosure relates to a buffer circuit having performances superior to those of a conventional buffer circuit as described above, as far as the withstand voltage and the pass band are concerned, with the performances of equal transistors.

Embodiments of the present disclosure relate to an integrated circuit on a semiconductor wafer, comprising a first data buffer circuit connected to a contact pad, the buffer circuit comprising: a first transistor and a second transistor in series, each having a conduction terminal connected to the contact pad; a third transistor in series with the first transistor; and a fourth transistor in series with the second transistor, as well as means for applying: a first bias voltage on a conduction terminal of the third transistor; a second bias voltage on a conduction terminal of the fourth transistor; a third bias voltage less than the second bias voltage on a control terminal of the first transistor; a fourth bias voltage greater than the first bias voltage on a control terminal of the second transistor; and a data signal on a control terminal of the third transistor and on a control terminal of the fourth transistor.

According to an embodiment, the first bias voltage is an internal power supply voltage of the integrated circuit.

According to an embodiment, the second bias voltage is a ground potential of the integrated circuit.

According to an embodiment, the first and second transistors are MOS transistors with a high withstand voltage and the third and fourth transistors are MOS transistors with a broad pass band.

According to an embodiment, the third and fourth transistors are MOS transistors having a first gate oxide thickness, the first and second transistors are MOS transistors having a second gate oxide thickness greater than the first gate oxide thickness.

According to an embodiment, the integrated circuit comprises: at least one control circuit comprising MOS transistors having a first gate oxide thickness; and a non-volatile memory comprising MOS transistors having a second gate oxide thickness greater than the first gate oxide thickness; the first and second transistors of the buffer circuit are MOS transistors having the second gate oxide thickness; and the third and fourth transistors of the buffer circuit are MOS transistors having the first gate oxide thickness.

According to an embodiment, the integrated circuit comprises boost means to supply the fourth bias voltage.

According to an embodiment, the integrated circuit comprises non-boosted means to supply the fourth bias voltage from an external voltage applied to the integrated circuit.

According to an embodiment, the integrated circuit comprises boost means to supply the third bias voltage.

According to an embodiment, the integrated circuit comprises means to apply to the boost means a setpoint signal determining the amplitude of the bias voltage supplied by the boost means, and means for storing the setpoint signal.

According to an embodiment, the integrated circuit comprises a USB port, contact pads to emit data, and a second buffer circuit of four transistors, the first buffer circuit linked to the first USB contact pad, and the second buffer circuit linked to the second USB contact pad.

According to an embodiment, the integrated circuit comprises: third and fourth buffer circuits, each comprising a first and a second transistor and linked respectively to the first USB contact pad and to the second USB contact pad; and a control circuit configured to deactivate the first and second buffer circuits, activate the third and fourth buffer circuits and initiate a communication by the intermediary of the third and fourth buffer circuits, then deactivate the third and fourth buffer circuits, activate the first and second buffer circuits, and continue the communication by the intermediary of the first and second buffer circuits.

According to an embodiment, the integrated circuit comprises means to supply to the buffer circuit a data signal comprising two identical signals.

According to an embodiment, the integrated circuit comprises a secure processor.

Embodiments of the present disclosure also relate to a portable device, in particular a chip card or SIM card, comprising an integrated circuit according to one of the above embodiments.

BRIEF DESCRIPTION OF THE SEVERAL VIEWS OF THE DRAWINGS

Embodiments of integrated circuits according to the disclosure will now be described in a non-limiting manner in relation with the following figures, in which.

DETAILED DESCRIPTION

Figure 2:
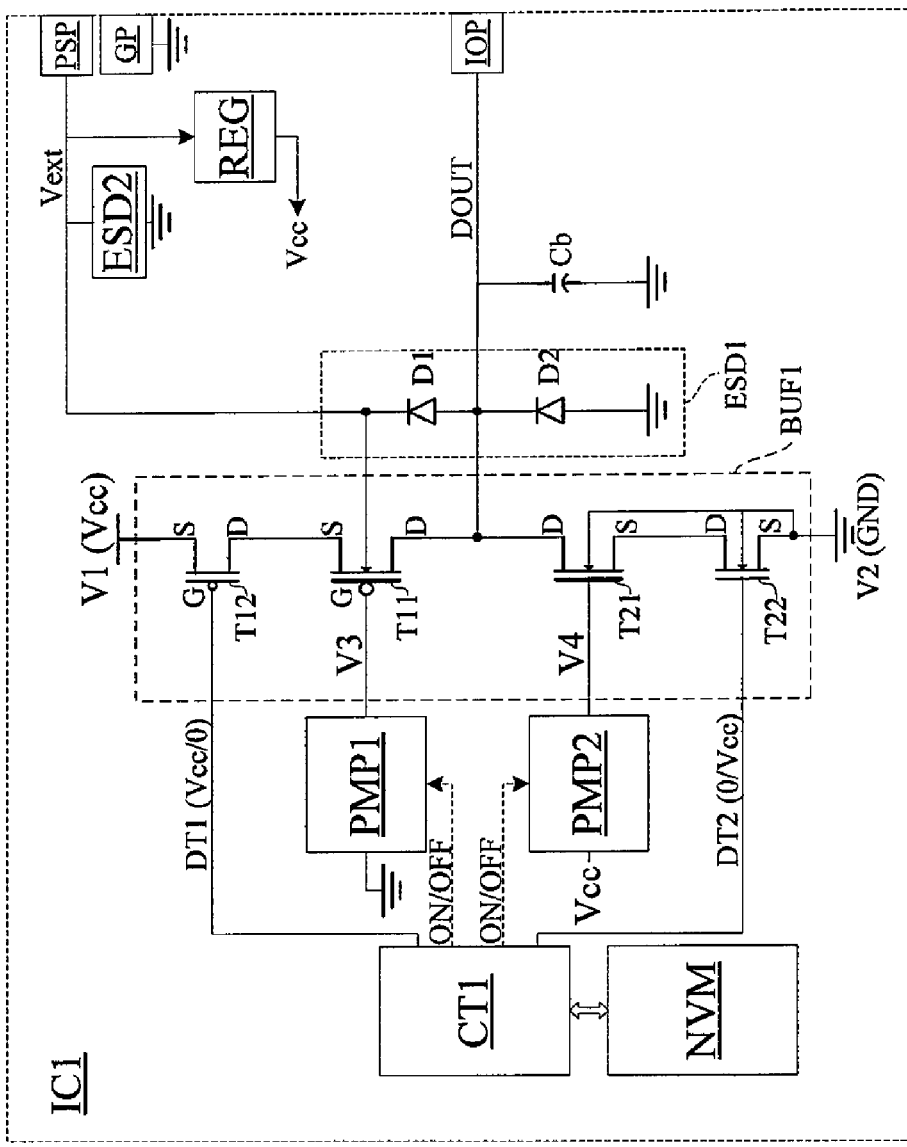
FIG. 2 shows schematically an embodiment of an integrated circuit comprising a buffer circuit according to the disclosure.
Figure 4:
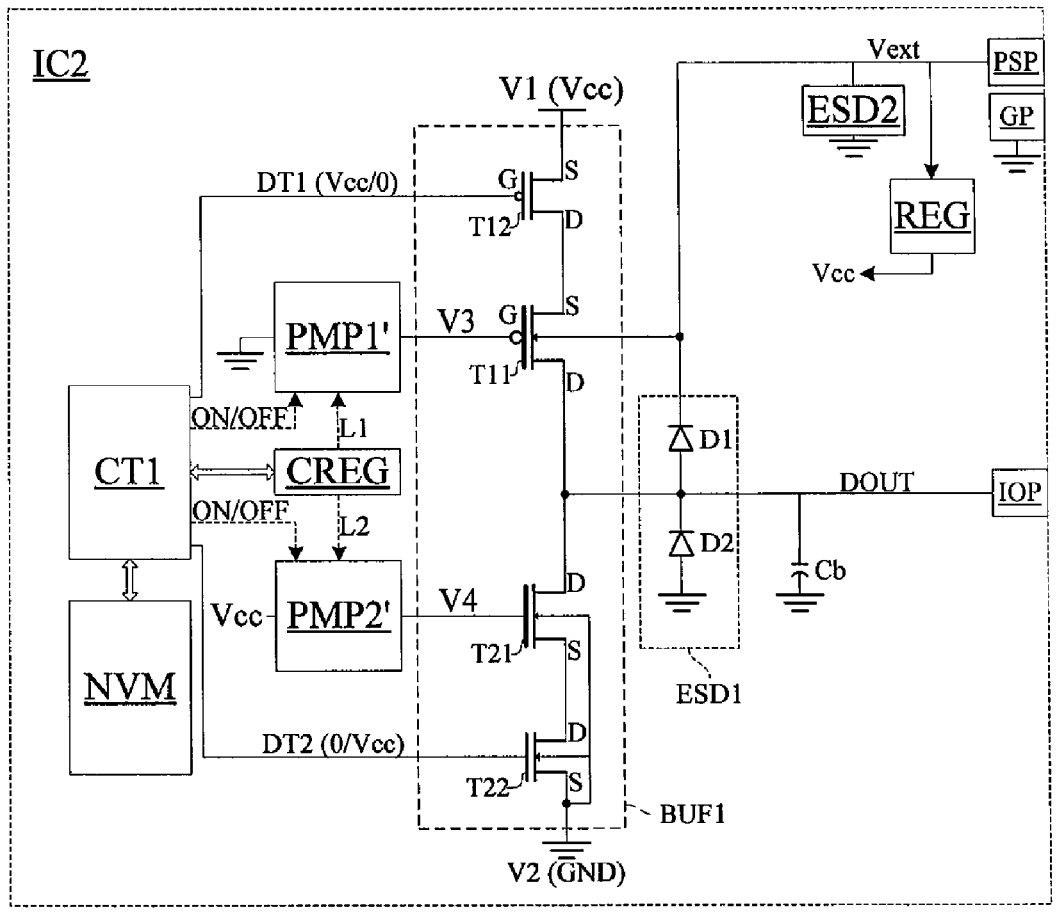
FIG. 4 shows an alternative embodiment of the integrated circuit of FIG. 2.

FIG. 2 and FIGS. 4 to 6 show integrated circuits IC1, IC2, IC3, IC4 according to the disclosure, produced by means of MOS transistors. In the following, the terms "source" and "drain" are used to designate the conduction terminals of the source and the drain of an MOS transistor and the term "gate" is used to designate the control terminal of the gate of such a transistor. The source and drain terminals of the MOS transistors are shown in FIGS. 2 and 4 by "S" and "D" and the control terminals of the gate are shown by "G".

The integrated circuit IC1 shown in FIG. 2 comprises a data buffer circuit BUF1 according to the disclosure. The integrated circuit equally comprises a contact pad IOP, a control circuit CT1, and a non-volatile memory NVM. The control circuit CT1 is for example a microprocessor, a microcontroller, or a hard-wired sequencer (state machine). The control circuit CT1 supplies a data signal DOUT to the contact pad IOP by the intermediary of buffer circuit BUF1. The data signal DOUT is applied to the buffer circuit BUF1 in the form of two identical signals DT1 and DT2, the polarities of which are the inverse of the signal DOUT, the buffer circuit BUF1 functioning as an inverter.

The buffer circuit BUF1 comprises transistors PMOS T11 and NMOS T21 of a first type and transistors PMOS T12 and NMOS T22 of a second type. The transistors of the first type have a thick gate oxide and have a high withstand voltage but a small pass band. The transistors of the second type have a thin gate oxide and have a broad pass band but a low withstand voltage.

The source of transistor T12 receives a bias voltage V1. The drain of transistor T12 is connected to the source of transistor T11. The drain of transistor T11 is connected to the drain of transistor T21. The drains of transistors T11 and T21 are connected to the pad IOP and supply the signal DOUT. The source of transistor T21 is connected to the drain of transistor T22. The source of transistor T22 receives a bias voltage V2, which is less than the bias voltage V1. The voltage V1 is for example an internal power supply voltage Vcc of the integrated circuit and the voltage V2 is for example a zero voltage or ground potential (GND) of the integrated circuit.

The gate of transistor T12 receives the signal DT1 and the gate of transistor T22 receives the signal DT2. The signals DT1, DT2 can be analog signals, the voltage values of which vary between a minimum voltage and a maximum voltage, or logic signals that have two voltage levels corresponding to logic 1 and 0, for example Vcc and 0 or any other voltage level able to provoke a change of the conductivity state (conducting or non-conducting) of transistors T12, T22.

Finally, the gate of transistor T11 receives a bias voltage V3 and the gate of transistor T21 receives a bias voltage V4. The voltage V3 is less than the low voltage that biases the buffer circuit, that is the voltage V2. The voltage V2 here being equal to the ground potential, the voltage V3 is a negative voltage. The voltage V4 is greater than the highest voltage that biases the buffer circuit, that is, the voltage V1. The voltage V1 here being equal to Vcc, the voltage V4 is a positive voltage greater than Vcc.

The voltage V3 is supplied by the output of a negative charge pump PMP1, the input of which is linked to ground. The bias voltage V4 is supplied by the output of a positive charge pump PMP2, the input of which receives the voltage Vcc. The charge pumps PMP1, PMP2 are controlled by the circuit CT1, which activates and deactivates them by means of signals ON/OFF.

In the embodiment shown in FIG. 2, the integrated circuit IC1 also receives an external supply voltage Vext, greater than Vcc, by the intermediary of a power supply pad PSP and a ground pad GP. The voltage Vcc is supplied by a voltage regulator REG receiving the voltage Vext on its input. In such an embodiment, the bias voltage V4 can be generated from the voltage Vext without using the charge pump PMP2, for example by means of an auxiliary regulator (not shown). The voltage V4 can also be the voltage Vext itself.

As a numeric example, an embodiment of integrated circuit IC1 can have the following parameters:
 Vext=3.6 V;
 V1=Vcc=1.3 V;
 V2=0 V;
 V3=−2 V;
 V4=3V;
 Transistors T12, T22:
  Gate oxide: 2 to 3 nm;
  Channel width: 90 nm;
  Withstand voltage: 1.3 V;
 Transistors T11, T21:
  Gate oxide: 20 nm;
  Channel width: depending upon needs and specifications;
  Withstand voltage: >10V.

Table 2 below describes the functioning of buffer circuit BUF1 in the case where V1=Vcc and V2=0 and where the signals DT1, DT2 are logic signals. As indicated above, the data signal DOUT supplied to the pad IOP is the inverse of logic signals DT1, DT2. The buffer circuit can moreover be placed in a high impedance (HZ) state by applying to transistors T11 and T21 bias voltages V3 and V4 respectively equal to Vcc and to 0 (ground), such that the transistors T11, T21 are non-conducting.

TABLE 2

| DT1 (T1) | DT2 (T2) | V3 | V4 | DOUT |
|---|---|---|---|---|
| indifferent 0 (GND) | indifferent 0 (GND) | Vcc negative (−2 v) | 0 >Vcc (3 V) | HZ 1 (Vcc) |
| 1 (Vcc) | 1 (Vcc) | negative (−2 v) | >Vcc (3 V) | 0 (GND) |

In one embodiment, the buffer BUF1 is configured such that it can resist, when it is in the non-conducting state (HZ), a voltage on the pad IOP that can reach the value of the external voltage Vext. In this case, the voltage Vext is applied to the channel of transistor T11, as shown in FIG. 2, and the voltage V3 is brought to Vext when the buffer is placed in the non-conducting state, as described by table 3 below.

TABLE 3

| DT1 (T1) | DT2 (T2) | V3 | V4 | DOUT |
|---|---|---|---|---|
| indifferent 0 (GND) | indifferent 0 (GND) | Vext negative (−2 v) | 0 >Vcc (3 V) | HZ 1 (Vcc) |
| 1 (Vcc) | 1 (Vcc) | negative (−2 v) | >Vcc (3 V) | 0 (GND) |

In yet another embodiment variation, it may be desired that the buffer BUF1 resist electrostatic discharges appearing on the pad IOP. In this case, the pad IOP is equipped with a protection circuit ESD1. The circuit ESD1 comprises for example a diode D1 linking the pad IOP to the pad PSP to absorb the positive voltage discharges, and a diode D2 linking the pad IOP to ground to absorb the negative voltage discharges. The pad PSP, which receives the voltage Vext, is itself linked to ground by the intermediary of a protection circuit ESD2.

Figure 3A:
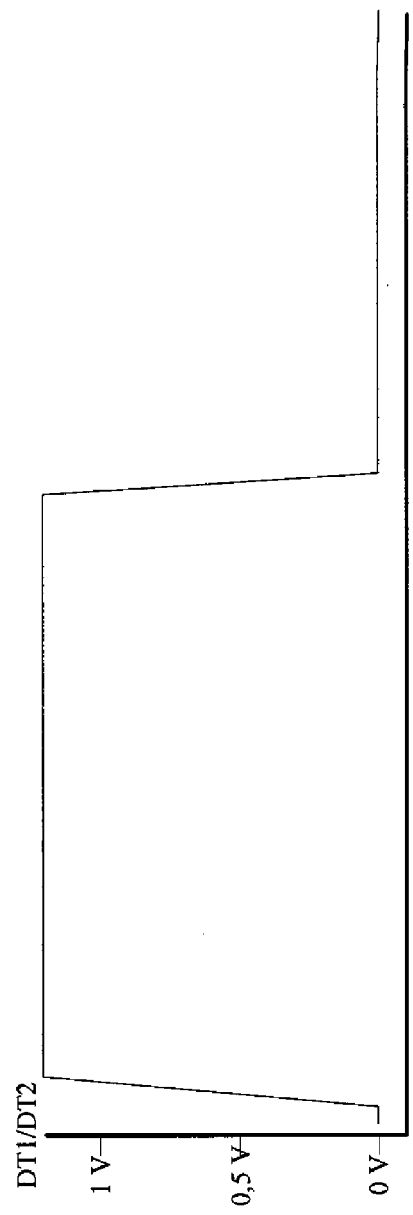
FIGS. 3A and 3B show the frequency response of the buffer circuit of FIG. 2 as a function of the amplitude of a bias voltage that is applied to it.
Figure 3B:
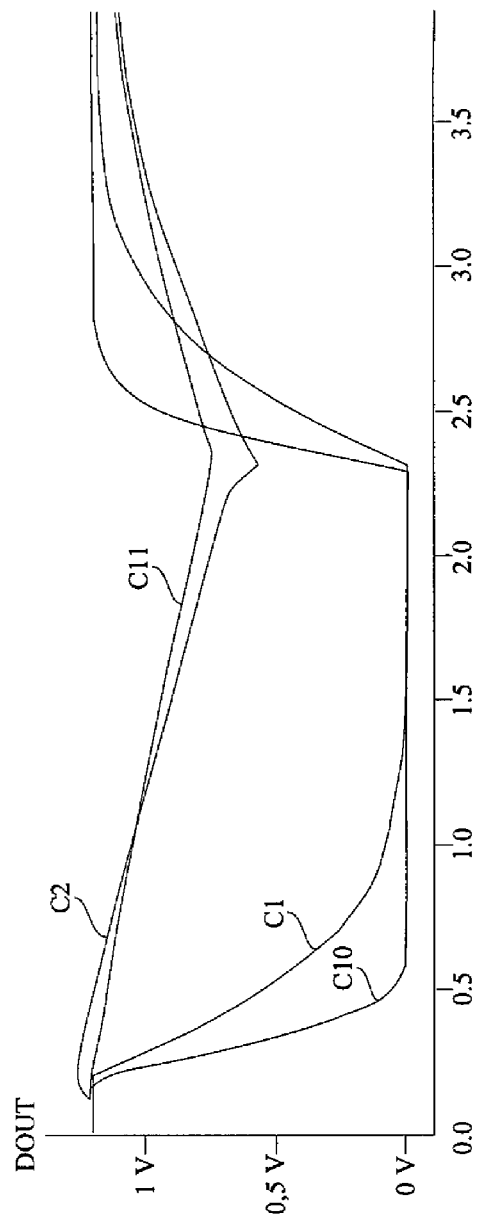

FIGS. 3A and 3B show the performances of buffer circuit BUF1 in terms of the pass band, as a function of the value of the bias voltages V3 and V4.

More particularly, FIG. 3A shows the signals DT1, DT2 switching from 0 to 1 and from 1 to 0, which corresponds to the application of a voltage range 0-Vcc-0 at the input of the buffer circuit (for example 0-1.3V-0). FIG. 3B shows curves C1, C2, C10, C11 that show the form of signal DOUT at the output of the buffer circuit. It is supposed here that the pad IOP is connected to a data bus having a non-zero parasitic capacitance, shown by a capacitor Cb in FIG. 2, for example a capacitor on the order of 14 pF. It is also supposed that the signals DT1, DT2 vary at a high frequency, for example the frequency 480 MHz as provided by the USB "High Speed" specification, the duration of their switching to 1 being therefore inferior to 1.04 ns if their duty cycle is equal to 0.5.

Figure 1:
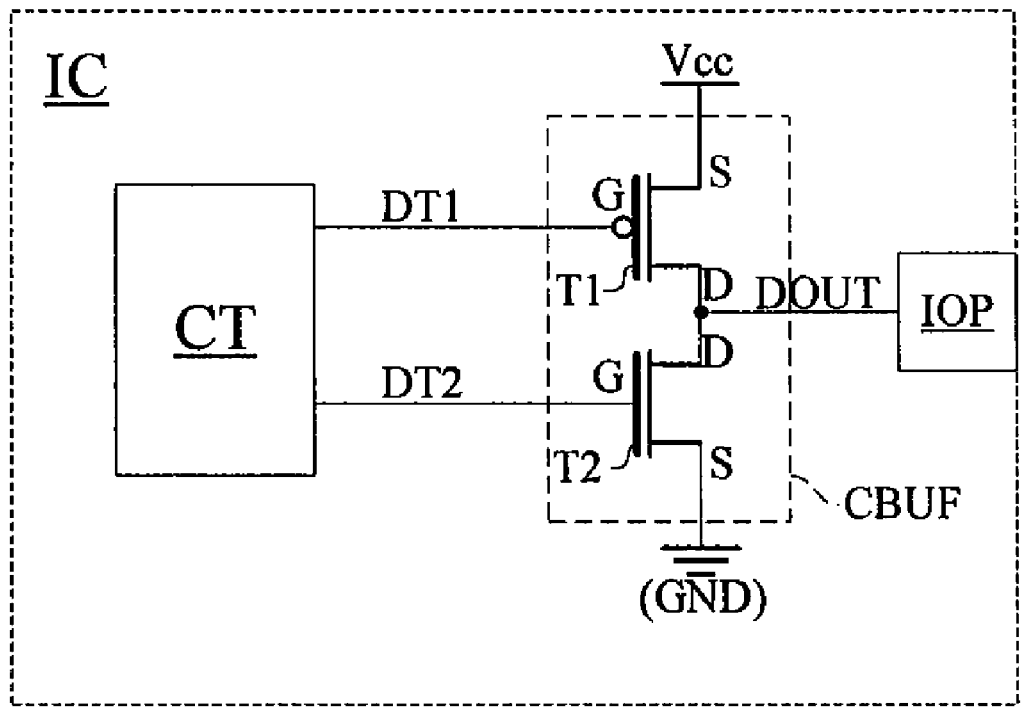
FIG. 1 previously described shows schematically an integrated circuit comprising a conventional buffer circuit.

The curves C1 to C11 show the response of the buffer circuit in four different cases:
 the curve C1 shows the signal DOUT when the voltages V3, V4 are equal to their nominal value, for example V3=−2 V and V4=+3 V;
 the curve C2 shows the signal DOUT when the voltages V3, V4 do not have boosted values, for example V3=0 V and V4=Vcc=1.3 V;
 the curve C10 shows the ideal response of a buffer circuit (or the response of buffer circuit BUF1 obtained at a lower frequency);
 the curve C11 shows the signal DOUT obtained by means of a conventional buffer circuit CBUF (Cf FIG. 1) produced with transistors T11, T21, in the same operating conditions.

It will be noted that the curves C1, C2, C10, C11 have relative values and are given for comparison purposes only. In practice, the specific forms of these curves depend on the dimensions of the transistors used, of the exact thicknesses of their gate oxides, and of various other technology parameters such as the nature of the semiconductor wafer, the composition of the gate oxide used, etc.

The curve C1 shows that the response of buffer BUF1 is close to the ideal shown by the curve C10. Indeed, the biasing of the gates of the transistors T11, T21 by means of the boost voltage V3, V4 diminishes their response times and consequently increases their pass band, which is intrinsically small due to the thickness of their gate oxide, as shown by curve C11. The transistors T11, T21 equally offer a broader pass band due to the fact that they function as followers whereas the transistors T12, T21, which intrinsically have a broad pass band due to their thin gate oxides, function as switches. Moreover, the transistors T11, T21, which are connected to the contact pad IOP, guarantee a good withstand voltage of buffer BUF1, the thicknesses of their gate oxides assuring a good breakdown resistance.

The curve C11 shows that the same transistors T11, T21 used in a conventional buffer CBUF structure (FIG. 1) cannot "follow" the signals DT1, DT2, such that the output signal DOUT has only a weak attenuation when the signals DT1, DT2 go to 1, insufficient to characterize the logical 0.

The curve C2 shows that the buffer BUF1 cannot, by itself, "follow" the signals DT1, DT2 when the gates of transistors T11, T21 are biased with non-boosted voltages V3, V4.

Thus, the buffer circuit BUF1 offers high performance both as far as the withstand voltage (thanks to the thick gate oxide transistors T11, T21) and as far as the pass band (thanks to the thin oxide transistors T12, T22 and to the biasing of the gates of transistors T11, T21 by means of voltages V3, V4) are concerned. It is thus possible to produce a high performance buffer circuit with an integrated circuit having only these two types of transistors, without it being necessary to provide a third type of transistor. Notably, the transistors T12, T22 can be transistors of the type used to produce the circuit CT1, such as logical transistors. The transistors T11, T21 can be of the type used to produce the memory NVM.

In certain functioning conditions, and notably in the presence of parasitic capacitances, it may occur that the output signal DOUT of a conventional buffer circuit shows one or more overshoots after switching, when the signals DT1, DT2 go from 0 to 1 or from 1 to 0, this phenomena being commonly called "overshoot" or "undershoot" by the skilled person. Such overshoots can also occur when using a buffer circuit according to the disclosure. In this case, it may be desired to reduce the pass band of the buffer circuit in order to diminish or even eliminate these phenomena.

The integrated circuit IC2 shown in FIG. 4 allows the user to modulate the pass band of the buffer circuit, notably to control a possible overshoot or undershoot. The integrated circuit IC2 differs from integrated circuit IC1 in that it comprises charge pumps PMP1', PMP2' with adjustable levels, supplying bias voltages V3, V4, the values of which are a function of setpoint signals L1, L2. The setpoint signals L1, L2 are supplied by the circuit CT1 and are stored in a setpoint register CREG. The values of signals L1, L2 can be chosen by the user by means of write commands of register CREG, which are executed by the circuit CT1. The user can therefore test "in situ" different values of signals L1, L2, then chose those that are best suited for the considered work frequency and as a function of the application parameters, including the electrical characteristics of the bus connected to the pad IOP.

A buffer circuit according to the disclosure is useful in diverse applications, notably to produce rapid bus interfaces (above 80 Kb/s for example) able to withstand high bus voltages.

Figure 5:
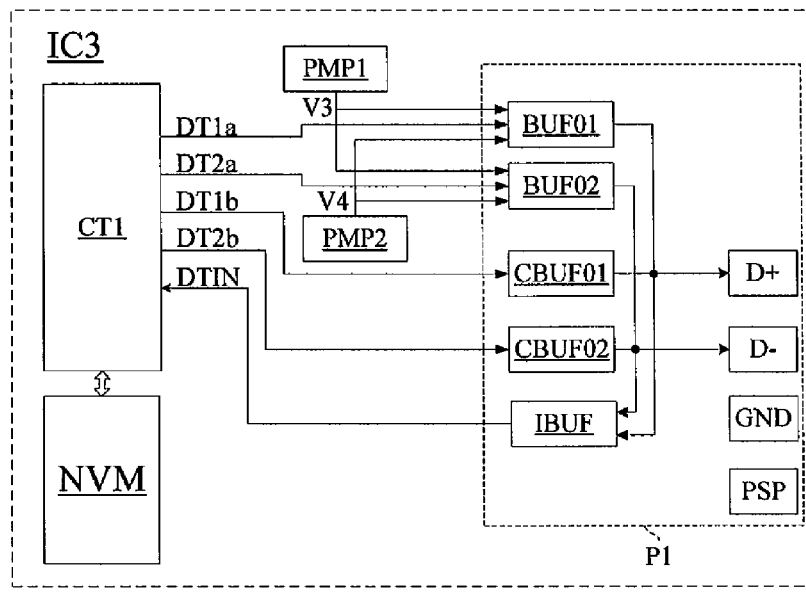
FIG. 5 shows schematically an embodiment of an integrated circuit comprising a USB port and buffer circuits according to the disclosure.

FIG. 5 shows schematically an integrated circuit IC3 according to the disclosure comprising the control circuit CT1 and a USB port designated P1. The port P1 comprises a power supply pad PSP, a ground contact GND, a contact D+, a contact D−, buffer circuits BUF01 and BUF02, buffer circuits CBUF01, CBUF02, and a circuit IBUF for the reception of data. The pad PSP receives here a voltage of 5 V that can be used as an external supply voltage Vext of the integrated circuit, the supply of the internal supply voltage Vcc being thus assured by a voltage regulator (not shown). The buffer circuits BUF01 and BUF02 are of the same structure as that of the buffer circuit BUF1 previously described (i.e., they comprise four transistors) and are biased by the voltages V3, V4 supplied by the charge pumps PMP1, PMP2 (or PMP1', PMP2'). The buffer circuits CBUF01 and CBUF02 are of a conventional type and are for example of the same structure as that of the buffer CBUF shown in FIG. 1. The buffers BUF01 and CBUF01 have their outputs connected to the contact D+. The buffers BUF02 and CBUF02 have their outputs connected to the contact D−. The circuit BUF01 receives a data signal DT1$a$, the circuit CBUF01 receives a data signal DT1$b$, the circuit BUF02 receives a data signal DT2$a$, and the circuit CBUF02 receives a data signal DT2$b$. The signals DT1$a$, DT1$b$, DT2$a$, DT2$b$ are supplied by the control circuit CT1. The circuit IBUF comprises a differential input connected to contacts D+, D−, and is configured to read the incoming data DTIN applied on the contacts D+, D− and to supply them to circuit CT1.

The circuit CT1 is configured to establish a USB communication in two steps:

a step of "Full Speed" communication where the circuit CT1 places the buffer circuits BUF01, BUF02 in the non-conducting state in the manner described above (Cf table 2 or 3) and where it activates the buffers CBUF01, CBUF02. In this case, the circuit CT1 supplies the signals DT1$b$, DT2$b$ to buffers CBUF01, CBUF02 when it emits the data, and uses the circuit IBUF to receive the data DTIN. During this first step, the circuit CT1 communicates with a distant device (not shown) and negotiates a switch into the mode "High Speed", a step of "High Speed" communication with the distant device, where the circuit CT1 places the buffer circuits CBUF01, CBUF02 in the non-conducting state in the manner described above (Cf table 1) and activates the buffer circuits BUF01, BUF02. In this case the circuit CT1 supplies the signals DT1$a$, DT2$a$ to buffers BUF01, BUF02 to emit the data, and uses the buffer circuit IBUF to receive the data.

Figure 6:
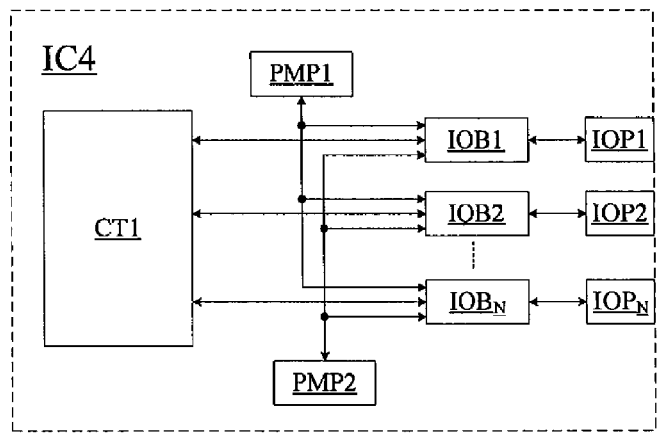
FIG. 6 shows schematically an embodiment of an integrated circuit comprising a plurality of buffer circuits according to the disclosure.

FIG. 6 shows another example of an integrated circuit IC4 according to the disclosure. The integrated circuit IC4 comprises contact pads IOP1, IOP2, . . . IOP$_N$, each connected to the output of an input/output circuit IOBi (IOB1, IOB2, . . . IOB$_N$). Each circuit IOBi comprises a buffer circuit BUF1 of the type previously described (not shown) and a data reception circuit of the differential (for example IBUF, FIG. 5) or non-differential ("single ended") type. Each circuit IOBi receives the bias voltages V3, V4 supplied by the charge pumps PMP1, PMP2 (or PMP1', PMP2') and is linked to the control circuit CT1 to receive data to emit or to supply data received via the contact to which it is connected (or received via the contacts to which it is connected, in differential mode).

An integrated circuit comprising one or more buffer circuits according to the disclosure can be an integrated circuit of a SIM ("Subscriber Identification Module") card equipped with a USB port. The circuit CT1 is in this case a secure processor equipped with cryptographic calculation means (hardware or software) to conduct an authentication procedure of an integrated circuit.

Figure 7:
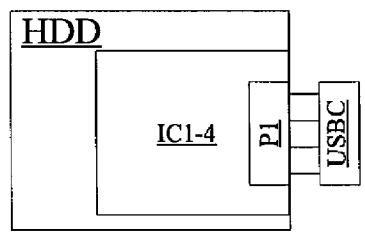
FIG. 7 shows schematically a portable object comprising an integrated circuit according to the disclosure.

FIG. 7 shows a portable device HDD ("Handheld Device") of the type chip card, SIM card, electronic tag, electronic identity card, mobile telephone, etc. The device HDD comprises an integrated circuit IC1-4 (IC1, IC2, IC3, or IC4). The integrated circuit IC1-4 comprises a USB port P1 of the type previously described in relation with FIG. 5. The device HDD comprises an electric connector USBC comprising contacts linked to contact pads of port P1 of the integrated circuit.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit on a semiconductor wafer, comprising:
   a contact pad; and
   a first data buffer circuit coupled to the contact pad, the first data buffer circuit including:
      a first transistor and a second transistor coupled together, each having a conduction terminal coupled to the contact pad;
      a third transistor in series with the first transistor, the third transistor having a conduction terminal coupled to a first bias voltage terminal configured to receive a first bias voltage; and
      a fourth transistor in series with the second transistor, the fourth transistor having a conduction terminal coupled to a second bias voltage terminal configured to receive a second bias voltage; and
   means for applying:
      a third bias voltage less than the second bias voltage on a control terminal of the first transistor,
      a fourth bias voltage greater than the first bias voltage on a control terminal of the second transistor, and
      data signals on a control terminal of the third transistor and on a control terminal of the fourth transistor, wherein the means for applying include:
         boost means for supplying the third bias voltage;
         means for storing a setpoint signal and for applying to the boost means the setpoint signal and determine an amplitude of the third bias voltage supplied by the boost means.

2. An integrated circuit according to claim 1, in which the first bias voltage is an internal power supply voltage of the integrated circuit.

3. An integrated circuit according to claim 1, in which the second bias voltage is a ground potential of the integrated circuit.

4. An integrated circuit according to claim 1, in which the first and second transistors are MOS transistors with a high withstand voltage and the third and fourth transistors are MOS transistors with a broad pass band.

5. An integrated circuit according to claim 1, in which the third and fourth transistors are MOS transistors having a first gate oxide thickness, the first and second transistors are MOS transistors having a second gate oxide thickness greater than the first gate oxide thickness.

6. An integrated circuit according to claim 1, comprising:
   at least one control circuit comprising MOS transistors having a first gate oxide thickness; and
   a non-volatile memory comprising MOS transistors having a second gate oxide thickness greater than the first gate oxide thickness, and in which:
      the first and second transistors of the buffer circuit are MOS transistors having the second gate oxide thickness, and
      the third and fourth transistors of the buffer circuit are MOS transistors having the first gate oxide thickness.

7. An integrated circuit according to claim 1, comprising boost means for supplying the fourth bias voltage.

8. An integrated circuit according to claim 1, comprising non-boosted means for supplying the fourth bias voltage from an external voltage applied to the integrated circuit.

9. An integrated circuit according to claim 1, comprising a USB port that includes first and second contact pads to emit data, and a second buffer circuit of four transistors, the first buffer circuit being linked to the first USB contact pad, and the second buffer circuit being linked to the second USB contact pad.

10. An integrated circuit according to claim 9, comprising:
   third and fourth buffer circuits, each comprising a first and a second transistor and linked respectively to the first USB contact pad and to the second USB contact pad; and
   a control circuit configured to:
      deactivate the first and second buffer circuits, activate the third and fourth buffer circuits and initiate a communication using the third and fourth buffer circuits, then
      deactivate the third and fourth buffer circuits, activate the first and second buffer circuits, and continue the communication using the first and second buffer circuits.

11. An integrated circuit according to claim 1, comprising means to supply to the buffer circuit a data signal comprising two identical signals.

12. An integrated circuit according to claim 1, comprising a secure processor.

13. A portable card device, comprising an integrated circuit that includes:
   a contact pad; and
   a first data buffer circuit coupled to the contact pad, the first data buffer circuit including:
      a first transistor and a second transistor coupled together, each having a conduction terminal coupled to the contact pad;
      a third transistor in series with the first transistor, the third transistor having a conduction terminal coupled to a first bias voltage terminal configured to receive a first bias voltage; and
      a fourth transistor in series with the second transistor, the fourth transistor having a conduction terminal coupled to a second bias voltage terminal configured to receive a second bias voltage; and
   means for applying:
      a third bias voltage less than the second bias voltage on a control terminal of the first transistor,
      a fourth bias voltage greater than the first bias voltage on a control terminal of the second transistor, and
      data signals on a control terminal of the third transistor and on a control terminal of the fourth transistor, wherein the means for applying include:
         boost means for supplying the third bias voltage;
         means for storing a setpoint signal and for applying to the boost means the setpoint signal and determine an amplitude of the third bias voltage supplied by the boost means.

14. A portable card device according to claim 13, in which the third and fourth transistors are MOS transistors having a first gate oxide thickness, the first and second transistors are MOS transistors having a second gate oxide thickness greater than the first gate oxide thickness.

15. A portable card device according to claim 13, wherein the integrated circuit further includes:
at least one control circuit comprising MOS transistors having a first gate oxide thickness; and
a non-volatile memory comprising MOS transistors having a second gate oxide thickness greater than the first gate oxide thickness, and in which:
the first and second transistors of the buffer circuit are MOS transistors having the second gate oxide thickness, and
the third and fourth transistors of the buffer circuit are MOS transistors having the first gate oxide thickness.

16. A method of using a first data buffer circuit that includes first and second transistors on a semiconductor substrate, a conduction terminal of each transistor coupled to a common contact pad, and third and fourth transistors on the semiconductor substrate, the third transistor being coupled electrically in series with the first transistor and the fourth transistor being coupled electrically in series with the second transistor, the method comprising:
applying first and second bias voltages on respective conduction terminals of the third and fourth transistors;
applying third and fourth bias voltages on respective control terminals of the first and second transistors, the third bias voltage less than the second bias voltage and the fourth bias voltage greater than the first bias voltage;
applying data signals on the control terminals of the third and fourth transistors;
boosting a circuit supply voltage to obtain a boosted circuit supply voltage;
applying a setpoint signal that determines an amplitude of the boosted circuit supply voltage; and
storing the setpoint signal.

17. The method of claim 16 wherein the first and second transistors are MOS transistors with a high withstand voltage and the third and fourth transistors are MOS transistors with a broad pass band.

18. The method of claim 16 wherein the third and fourth transistors are MOS transistors having a first gate oxide thickness, and the first and second transistors are MOS transistors having a second gate oxide thickness that is greater than the first gate oxide thickness.

19. The method of claim 16 further comprising:
deactivating the first buffer circuit and a second buffer circuit that includes four transistors, the first and second buffer circuits being electrically coupled to first and second USB contact pads, respectively;
activating a third and a fourth buffer circuit, electrically coupled to the first and second USB contact pads, respectively;
initiating a communication using the third and fourth buffer circuits;
deactivating the third and fourth buffer circuits;
activating the first and second buffer circuits; and
continuing the communication using the first and second buffer circuits.

20. The method of claim 16 further comprising supplying to the buffer circuit a data signal having two identical signals.

21. An integrated circuit on a semiconductor wafer, comprising:
a first data buffer circuit that includes:
an output port;
a first transistor and a second transistor coupled together and each having a conduction terminal coupled to the output port;
a third transistor in series with the first transistor and having a conduction terminal configured to be coupled to a first bias voltage; and
a fourth transistor in series with the second transistor and having a conduction terminal configured to be coupled to a second bias voltage;
a first voltage generator configured to provide a third bias voltage, less than the second bias voltage, on a control terminal of the first transistor;
a second voltage generator configured to provide a fourth bias voltage, greater than the first bias voltage, on a control terminal of the second transistor;
a data supply circuit configured to provide data signals on a control terminal of the third transistor and on a control terminal of the fourth transistor; and
a setpoint register configured to store a setpoint signal and apply the setpoint signal to the first voltage generator, the first voltage generator being configured set an amplitude of the third bias voltage based on the setpoint signal.

22. An integrated circuit according to claim 21, further comprising a USB port that includes first and second contact pads to emit data, and a second buffer circuit of four transistors, the first buffer circuit being linked to the first USB contact pad, and the second buffer circuit being linked to the second USB contact pad.

23. An integrated circuit according to claim 21, comprising:
a USB port that includes first and second contact pads to emit data;
a second buffer circuit of four transistors, the first buffer circuit being linked to the first contact pad, and the second buffer circuit being linked to the second contact pad;
third and fourth buffer circuits, each including a first and a second transistor and an output linked respectively to the first contact pad and to the second contact pad; and
a control circuit configured to:
deactivate the first and second buffer circuits, activate the third and fourth buffer circuits and initiate a transmission of data to the first and second contact pads using the third and fourth buffer circuits, and
after initiating the transmission, deactivate the third and fourth buffer circuits, activate the first and second buffer circuits, and continue the transmission of data to the first and second contact pads using the first and second buffer circuits.

24. An integrated circuit on a semiconductor wafer, comprising:
a port that includes first and second contact pads to emit data;
a first data buffer circuit that includes:
an output node coupled to the first contact pad;
a first transistor and a second transistor coupled together and each having a conduction terminal coupled to the output node;
a third transistor in series with the first transistor and having a conduction terminal configured to be coupled to a first bias voltage; and
a fourth transistor in series with the second transistor and having a conduction terminal configured to be coupled to a second bias voltage;
a first voltage generator configured to provide a third bias voltage, less than the second bias voltage, on a control terminal of the first transistor;
a second voltage generator configured to provide a fourth bias voltage, greater than the first bias voltage, on a control terminal of the second transistor; and a second buffer circuit that includes four transistors, the second buffer circuit having an output coupled to the second contact pad;

a third buffer circuit including first and second transistors and an output coupled to the first contact pad;

a fourth buffer circuit including first and second transistors and an output coupled to the second contact pad; and a control circuit configured to provide data signals to a control terminal of the third transistor, to a control terminal of the fourth transistor, and to the third and fourth buffer circuits;

a control circuit configured to:

deactivate the first and second buffer circuits, activate the third and fourth buffer circuits and initiate a transmission of data to the first and second contact pads using the third and fourth buffer circuits, and after initiating the transmission, deactivate the third and fourth buffer circuits, activate the first and second buffer circuits, and continue the transmission of data to the first and second contact pads using the first and second buffer circuits.

25. An integrated circuit according to claim 24, in which the first and second transistors of the first buffer circuit are MOS transistors with a high withstand voltage and the third and fourth transistors of the first buffer circuit are MOS transistors with a broad pass band.

26. An integrated circuit according to claim 24, in which the third and fourth transistors of the first buffer circuit are MOS transistors having a first gate oxide thickness, the first and second transistors of the first buffer circuit are MOS transistors having a second gate oxide thickness greater than the first gate oxide thickness.

27. An integrated circuit according to claim 24, comprising a setpoint register configured to store a setpoint signal and apply the setpoint signal to the first voltage generator, the first voltage generator being configured set an amplitude of the third bias voltage based on the setpoint signal.

* * * * *